United States Patent
Sato et al.

(10) Patent No.: US 8,441,023 B2
(45) Date of Patent: May 14, 2013

(54) SEMICONDUCTOR LIGHT EMITTING DEVICE

(75) Inventors: Taisuke Sato, Kanagawa-ken (JP);
Masanobu Ando, Kanagawa-ken (JP);
Hajime Nago, Kanagawa-ken (JP);
Koichi Tachibana, Kanagawa-ken (JP);
Toshiyuki Oka, Kanagawa-ken (JP);
Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 13/226,045

(22) Filed: Sep. 6, 2011

(65) Prior Publication Data
US 2012/0056220 A1 Mar. 8, 2012

Related U.S. Application Data

(63) Continuation of application No. PCT/JP2009/004702, filed on Sep. 17, 2009.

(51) Int. Cl.
*H01L 33/00* (2010.01)
(52) U.S. Cl.
USPC ............................................. 257/96; 257/79
(58) Field of Classification Search ............ 257/96, 257/79
See application file for complete search history.

(56) References Cited

U.S. PATENT DOCUMENTS

| 6,015,979 | A | 1/2000 | Sugiura et al. |
| 6,316,785 | B1 | 11/2001 | Nunoue et al. |
| 7,732,802 | B2 * | 6/2010 | Cho et al. ................ 257/13 |
| 2008/0121903 | A1 | 5/2008 | Hiramatsu et al. |
| 2009/0032830 | A1 * | 2/2009 | Li ........................... 257/98 |

FOREIGN PATENT DOCUMENTS

JP 2008-153634 7/2008

OTHER PUBLICATIONS

U.S. Appl. No. 09/427,621.

* cited by examiner

*Primary Examiner* — Douglas Menz
(74) *Attorney, Agent, or Firm* — Oblon, Spivak, McClelland, Maier & Neustadt, L.L.P.

(57) ABSTRACT

According to one embodiment, in a light emitting device, a substrate is transparent to a wavelength of emitted light. A first dielectric layer is formed in a first region on the substrate, and has a refractive index smaller than a refractive index of the substrate. A second dielectric layer is formed in a second region on the substrate surrounding the first region, and has a refractive index larger than the refractive index of the substrate. A first semiconductor layer is formed on the first dielectric layer, the second dielectric layer and the substrate. A second semiconductor layer is formed on the first semiconductor layer, and includes an active layer having a PN junction.

9 Claims, 18 Drawing Sheets

US 8,441,023 B2

SEMICONDUCTOR LIGHT EMITTING DEVICE

CROSS REFERENCE TO RELATED APPLICATION

This application is based upon and claims the benefit of priority from PCT/JP2009/004702, filed on Sep. 17, 2009, the entire contents of which are incorporated herein by reference.

FIELD

Embodiments described herein relate generally to a semiconductor light emitting device.

BACKGROUND

Conventionally, a semiconductor light emitting device has been known which is improved in the efficiency of light extraction from the semiconductor light emitting device by forming on a substrate multiple protruding portions made of a dielectric material having a refractive index different from that of the substrate, growing a nitride-based semiconductor layer on the substrate around the protruding portions, and then laterally growing the nitride-based semiconductor layer (Japanese Patent Application Publication No. 2008-153634).

In the semiconductor light emitting device, the protruding portions made of a ferroelectric material are divided into two groups, and different external electric fields are applied to the two groups, respectively. This makes the refractive indices of the respective two groups different from each other. Thereby, the light extraction efficiency of the semiconductor light emitting device is controlled.

In the semiconductor light emitting device, however, the difference in refractive index caused by the external electric fields is determined by the electro-optical properties of the ferroelectric material, and is in the order of several percent of the refractive index of the ferroelectric material at the most. As a result, a sufficient difference in the refractive index cannot be obtained, which causes a problem that a sufficient light extraction efficiency cannot be obtained.

BRIEF DESCRIPTION OF THE DRAWINGS

FIG. 1A is a plan view of the semiconductor light emitting device, FIG. 1B is a cross-sectional view taken along the A-A line of FIG. 1A and viewed in the direction indicated with arrows A;

DETAILED DESCRIPTION

Figure 1A:
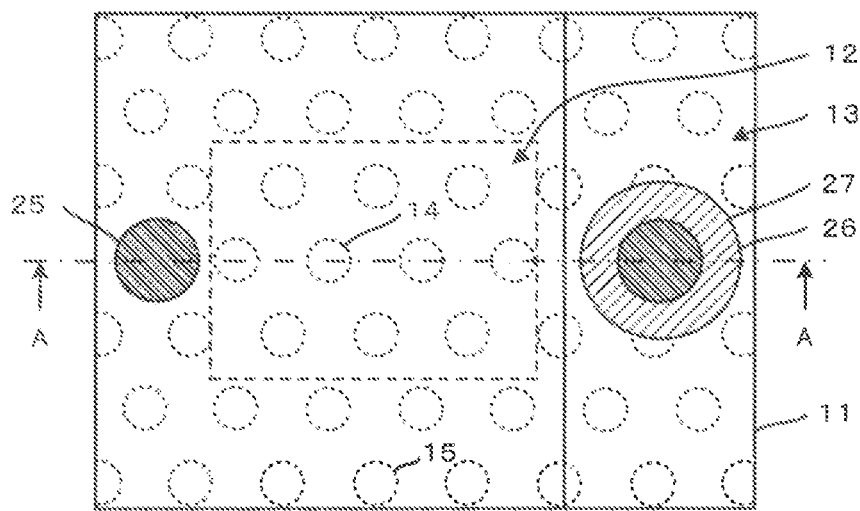
FIGS. 1A and 1B are views showing the semiconductor light emitting device according to a first embodiment.

According to one embodiment, in a light emitting device, a substrate is transparent to a wavelength of emitted light. A first dielectric layer is formed in a first region on the substrate, and has a refractive index smaller than a refractive index of the substrate. A second dielectric layer is formed in a second region on the substrate surrounding the first region, and has a refractive index larger than the refractive index of the substrate. A first semiconductor layer is formed on the first dielectric layer, the second dielectric layer and the substrate. A second semiconductor layer is formed on the first semiconductor layer, and includes an active layer having a PN junction.

Hereinafter, embodiments will be described with reference to the drawings. In the drawings, same reference characters denote the same or similar portions.

First Embodiment

Figure 1B:
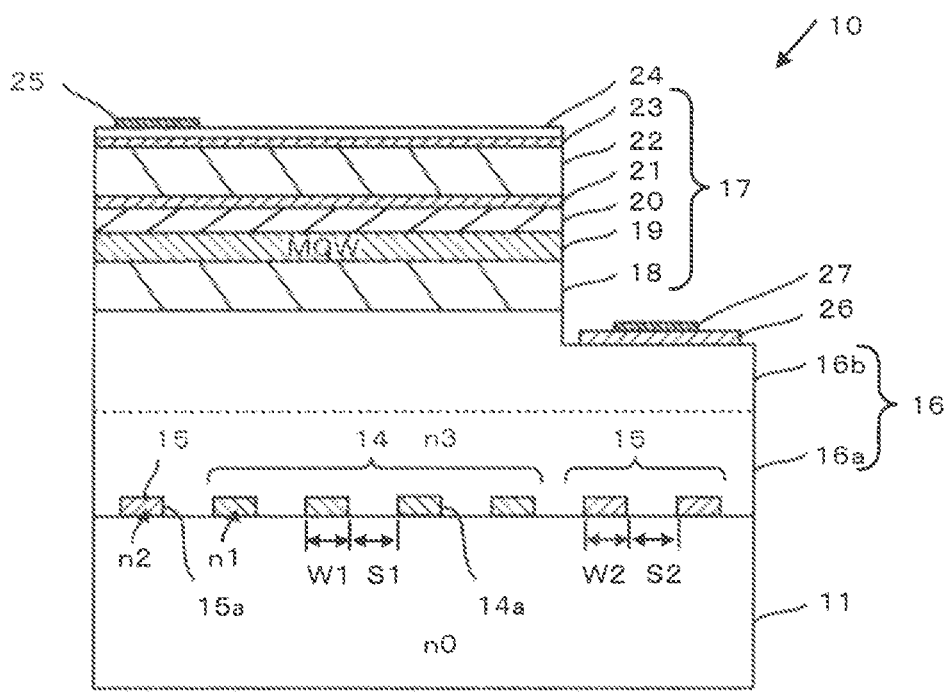
Figure 2:
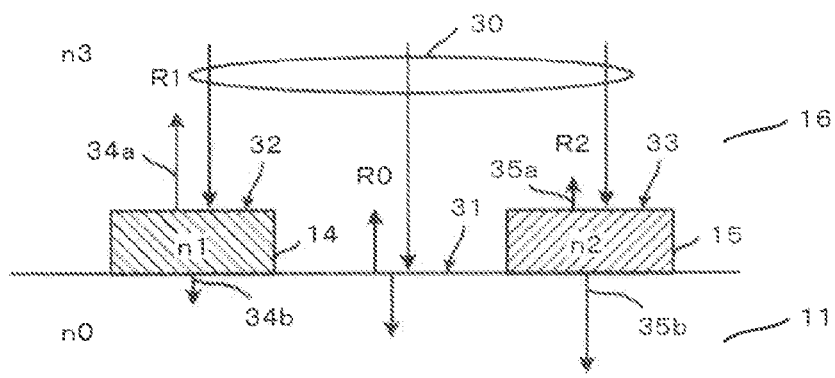
FIG. 2 is a diagram showing light reflection characteristics of a first dielectric layer and a second dielectric layer.

A semiconductor light emitting device of a first embodiment will be described with reference to FIGS. 1A to 2. FIGS. 1A and 1B are views showing the semiconductor light emitting device. FIG. 1A is a plan view of the semiconductor light emitting device. FIG. 1B is a cross-sectional view taken along the A-A line of FIG. 1A and viewed in the direction indicated with arrows A. FIG. 2 is a diagram showing light reflection characteristics of a first dielectric layer and a second dielectric layer, respectively.

As shown in FIGS. 1A and 1B, in a semiconductor light emitting device 10 of the embodiment, a first region 12 is provided on a substrate 11 transparent to the wavelength of emitted light, and a second region 13 is provided on the substrate 11 in a manner that makes the second region 13 surround the first region 12. In this respect, the first region 12 is a central region of a top surface of the substrate 11, and the second region 13 is a peripheral region of the top surface of the substrate 11.

In the first region 12, a first dielectric layer 14 is formed which has a refractive index n1 smaller than a refractive index n0 of the substrate 11. In the second region 13, a second dielectric layer 15 is formed which has a refractive index n2 larger than the refractive index n0 of the substrate 11.

The first dielectric layer 14 includes multiple islands formed in a scattered manner in the first region 12 on the substrate 11, and the second dielectric layer 15 includes multiple islands formed in a scattered manner in the second region 13 on the substrate 11.

The islands of the first dielectric layer 14 each have a circular shape, and are arranged in a mesh, for example. In this configuration, the islands are arranged at the vertexes and center of each regular hexagon. In this respect, a ratio of a width W1 of each island of the first dielectric layer 14 to a space S1 between each two adjacent islands of the first dielectric layer 14 in the X direction is set to 3:2. W1:S1 is not limited to 3:2, and it is desirable that W1:S1 should be within a range of 4:1 to 1:5, for example, in terms of the light extraction efficiency.

Similarly, the islands of the second dielectric layer 15 each have a circular shape, and are arranged in a mesh, for example. In this configuration, the islands are arranged at the vertexes and center of each regular hexagon. In this respect, a ratio of a width W2 of each island of the second dielectric layer 15 to a space S2 between each two adjacent islands of the second dielectric layer 15 in the X direction is set to 3:2. W2:S2 is not limited to 3:2, and it is desirable that W2:S2 should be within a range of 9:1 to 1:4, for example, in terms of the light extraction efficiency.

Side surfaces 14a of the first dielectric layer 14 and side surfaces 15a of the second dielectric layer 15 are substantially perpendicular to the substrate 11. Accordingly, the first dielectric layer 14 and the second dielectric layer 15 have rectangular cross sections, respectively.

The substrate 11 is made of a sapphire ($Al_2O_3$) whose refractive index n0 to blue light is about 1.7, for example. The first dielectric layer 14 is made of a silicon oxide ($SiO_2$) whose refractive index n1 to the blue light is about 1.4, for example. The second dielectric layer 15 is made of a silicon nitride ($Si_3N_4$) whose refractive index n2 to the blue light is about 2.0 for example.

A first semiconductor layer 16 made of a nitride-based group III-V compound semiconductor is formed on the first dielectric layer 14, the second dielectric layer 15, and the substrate 11. The first semiconductor layer 16 is a semiconductor layer having a substantially flat surface, and is formed as follows. As described later, the first semiconductor layer 16 is grown selectively on part of the substrate 11 with the first dielectric layer 14 and the second dielectric layer 15 used as masks, and then laterally grown with facets being formed. Thus, the first semiconductor layer 16 grows from every side of the first and second dielectric layers 14, 15, and growing portions of the first semiconductor layer 16 unite together. Thereby, the first semiconductor layer 16 is formed on the first dielectric layer 14, the second dielectric layer 15, and the substrate 11.

The first semiconductor layer 16 is a layer made of an N-type gallium nitride (GaN) which has a thickness of about 5 μm and which is formed on the sapphire substrate 11 with a GaN buffer layer (not shown) interposed in between for example. A lower portion 16a of the first semiconductor layer 16 is a GaN layer doped with no impurity, and an upper portion 16b of the first semiconductor layer 16 is an N-type GaN layer doped with silicon (Si) serving as an impurity. The refractive index n3 of GaN to the blue light is about 2.4.

A second semiconductor layer 17 which includes an active layer having a PN junction, and which is made of a nitride-based group III-V compound semiconductor is formed on the first semiconductor layer 16.

The second semiconductor layer 17 includes an N-type GaN layer 18 formed on the GaN layer 16, a multi-quantum well (MQW) active layer 19, a P-type GaN first layer 20, a P-type GaAlN layer (electron overflow prevention layer) 21, a P-type GaN second layer 22, and a P-type GaN contact layer 23, for example. The functions of the respective layers are well known, and thus descriptions of the functions are omitted.

An indium tin oxide (ITO) transparent electrode 24 is formed on the P-type GaN contact layer 23. A pad 25 for wire bonding is formed on the transparent electrode 24.

Moreover, one lateral-side portion of the semiconductor light emitting device 10 is dug from the transparent electrode 24 to a portion of the GaN layer 16, and an N-side electrode 26 is formed on the exposed portion of the GaN layer 16. A pad 27 for wire bonding is formed on the N-side electrode 26.

Light is emitted from the MQW active layer 19, when the pads 25, 27 are connected to a power source and an electric current is caused to flow between the pads 25, 27.

In the semiconductor light emitting device having the structure described above, the first dielectric layer 14 having the width W1 and the space S1 as well as the second dielectric layer 15 having the width W2 and the space S2 enables the first semiconductor layer 16 to be formed by epitaxial lateral overgrowth (ELO), and are configured to improve the efficiency of the light extraction from the semiconductor light emitting device 10.

FIG. 2 is a diagram showing the light reflection characteristics of the first dielectric layer 14 and the second dielectric layer 15 in the semiconductor light emitting device 10. As shown in FIG. 2, some of beams of light 30 emitted to the substrate 11 from the MQW active layer 19 are reflected toward the MQW active layer 19 by an interface 31 between the substrate 11 and the first semiconductor layer 16, and most of the beams of the light 30 pass through the interface 31. The reflectance R0 of light perpendicularly incident on the interface 31 is about 0.03.

Meanwhile, the existence of the first dielectric layer 14 makes the reflectance R1 of light perpendicularly incident on an interface 32 between the first dielectric layer 14 and the first semiconductor layer 16 equal to about 0.07. This is because the refractive index n1 is smaller than the refractive index n0. The reflectance R1 is larger than the reflectance R0, and is about twice as large as the reflectance R0.

On the contrary, the existence of the second dielectric layer 15 makes the reflectance R2 of light perpendicular incident on an interface 33 between the second dielectric layer 15 and the first semiconductor layer 16 equal to approximately 0.01, because the refractive index n2 is larger than the refractive index n0. The reflectance R2 is lower than the reflectance R0, and is approximately one third of the reflectance R0.

In the first region 12 of the semiconductor light emitting device 10, among the beams of light 30, beams of light which pass through the interface 31 and then laterally propagate while repeating reflection multiple times inside the semiconductor light emitting device 10 propagate longer distances until reaching the side surfaces of the semiconductor light emitting device 10. As a result, the probability of the beams of light being extracted to the outside from the side surfaces of the semiconductor light emitting device 10 decreases through absorption of some beams of light on the way to the side surfaces of the semiconductor light emitting device 10.

With this taken into consideration, the light extraction efficiency can be increased using the first dielectric layer 14 by increasing the amount of light 34a in the light 30 which returns to the second semiconductor layer 17 after reflected by the interface 32, and thus decreasing the amount of light 34b in the light 30 which is transmitted through the first dielectric layer 14 to the substrate 11.

On the other hand, in the second region 13 of the semiconductor light emitting device 10, among the beams of light 30, beams of light which pass through the interface 31 and then laterally propagate while repeating reflection multiple times inside the semiconductor light emitting device 10 propagate shorter distances until reaching the side surfaces of the semiconductor light emitting device 10. As a result, the probability of the beams of light being extracted to the outside from the side surfaces of the semiconductor light emitting device 10 through avoidance of the absorption on the way to the side surfaces of the semiconductor light emitting device 10 increases.

With this taken into consideration, the light extraction efficiency can be increased using the second dielectric layer 15 by decreasing the amount of light 35a in the light 30 which returns to the second semiconductor layer 17 after reflected by the interface 33, and thus increasing the amount of light 35b in the light 30 which is transmitted through the second dielectric layer 15 to the substrate 11.

To confirm this, a simulation was conducted on the light extraction efficiency of the semiconductor light emitting device 10. The results of the simulation are described below.

Figure 3:
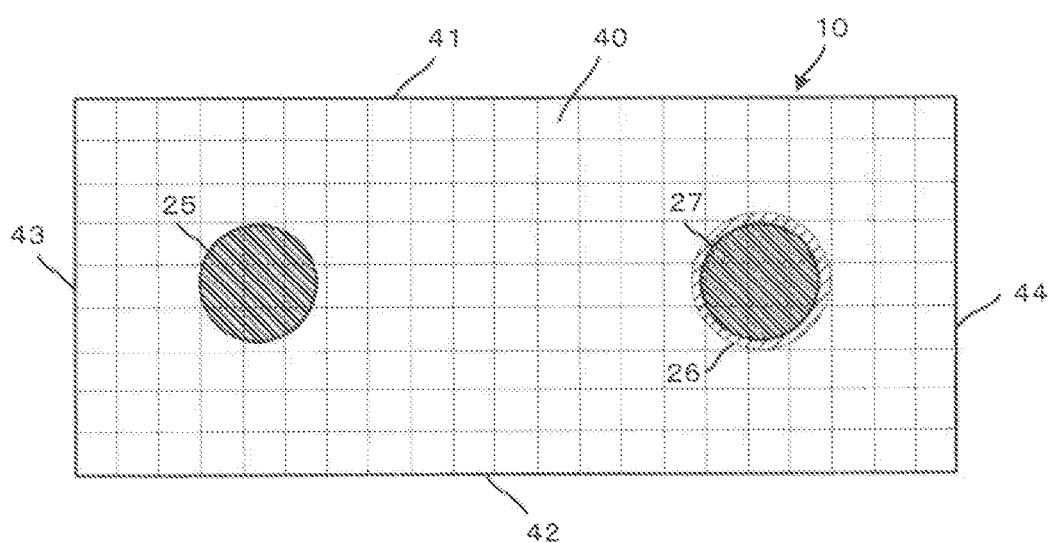
FIG. 3 is a diagram to explain the simulation on the light extraction efficiency of the semiconductor light emitting device.

FIG. 3 is a diagram to explain the simulation on the light extraction efficiency. As shown in FIG. 3, the simulation was performed by dividing the MQW active layer 19 into fragments of a mesh, and employing a ray tracing method. In this respect, the semiconductor light emitting device 10 was shaped like a rectangular solid shape for the purpose of making calculations easier. Parameters were set as follows. The size of the semiconductor device was 540 μm×290 μm, the size of the first region 12 was 430 μm×180 μm, the widths W1, W2 were each 3 μm, and the spaces S1, S2 were each 2 μm.

Moreover, a bottom surface of the substrate 11 was designed to exhibit Lambertian reflection with a reflectance of 90%. Exhibiting Lambertian reflection means that light incident on the bottom surface is scattered and the brightness of the bottom surface viewed from an observer is the same irrespective of an angle at which the bottom surface is viewed.

Paths of many beams of light emitted from the MQW active layer 19 in various directions and propagating while reflected, refracted, and absorbed in the semiconductor light emitting device 10 were traced in each of the fragments forming the mesh. Then, the intensity of the beams of light extracted to the outside of the semiconductor light emitting device 10 from each of a top surface 40, a side surface 41, a side surface 42, a side surface 43, and a side surface 44 was found. The total of the intensities was set as the light extraction efficiency for the corresponding fragment of the mesh. Hereafter, the top surface 40 and the side surfaces 41, 42, 43, 44 are collectively called an entire surface.

Figure 4:
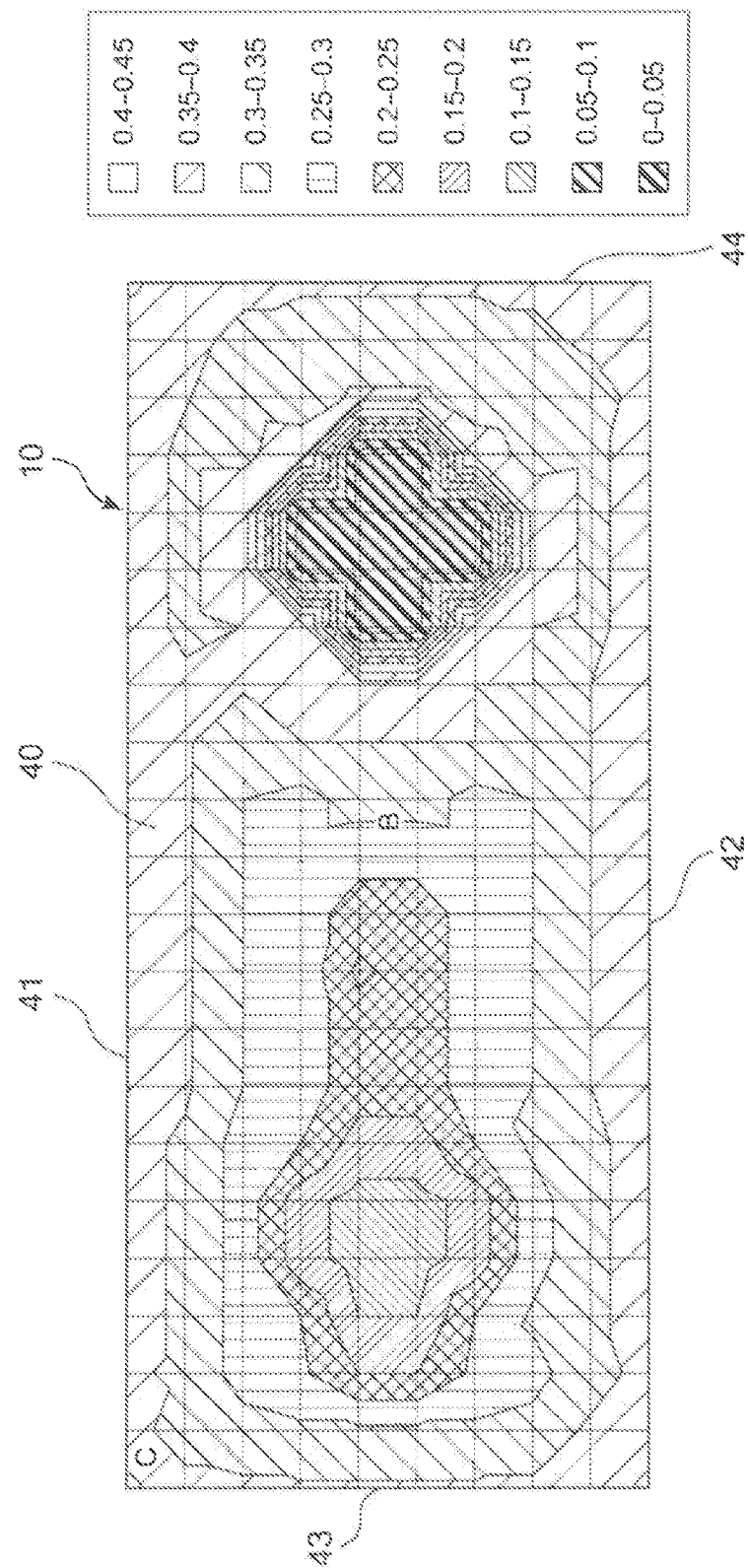
FIG. 4 is a diagram showing the in-plane distribution of the light extraction efficiency of the semiconductor light emitting device.

FIG. 4 is a diagram showing the in-plane distribution of the light extraction efficiency of the semiconductor light emitting device 10. As shown in FIG. 4, the in-plane distribution of the light extraction efficiency was roughly divided into regions around the respective electrodes, a central region and a peripheral region of the semiconductor light emitting device 10 in the ascending order of the light extraction efficiency.

With regard to the regions around the electrodes, no beam of light was extracted to the outside of the semiconductor light emitting device 10 from the top surface 40, since the beams of light were blocked by the pad 25 and the electrode 26. That was because there remained only beams of light extracted to the outside of the semiconductor light emitting device 10 from the side surfaces as a result of the laterally propagation through the multiple repeated reflections.

With regard to the central region, that was because there remained mainly beams of light extracted to the outside of the semiconductor light emitting device 10 from the top surface 40 as a result of the absorption of beams of light laterally propagating through the multiple repeated reflections since the central region was far from the side surfaces.

With regard to the peripheral region, that was because there remained mainly beams of light extracted to the outside of the semiconductor light emitting device 10 from the side surfaces as a result of the lateral propagation through the multiple repeated reflections since the peripheral portion was close to the side surfaces.

Figure 5:
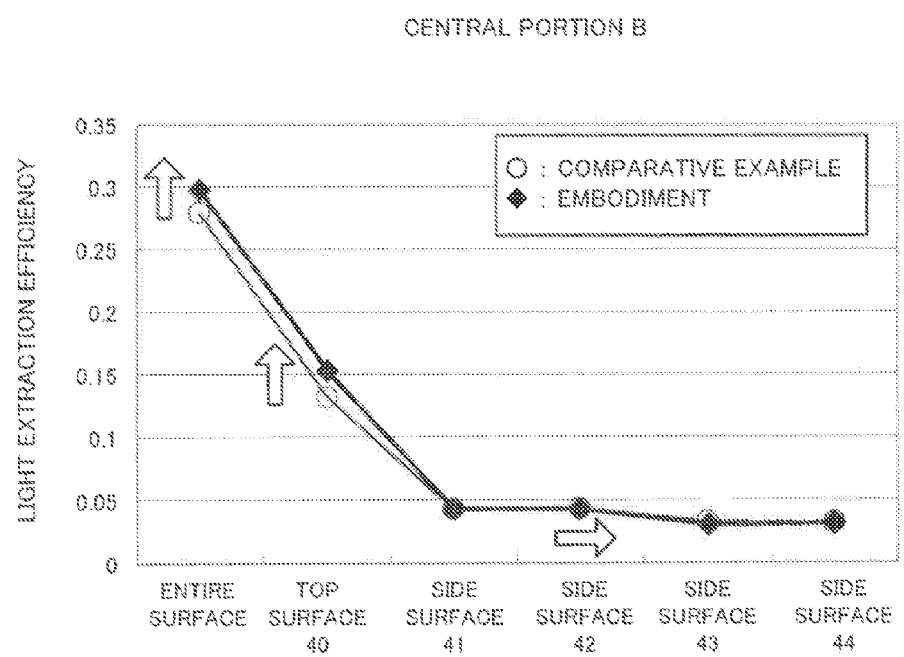
FIG. 5 is a diagram of a comparison between the first embodiment and a comparative example in terms of the efficiencies of light extraction from the semiconductor light emitting device in each of a central portion.
Figure 6:
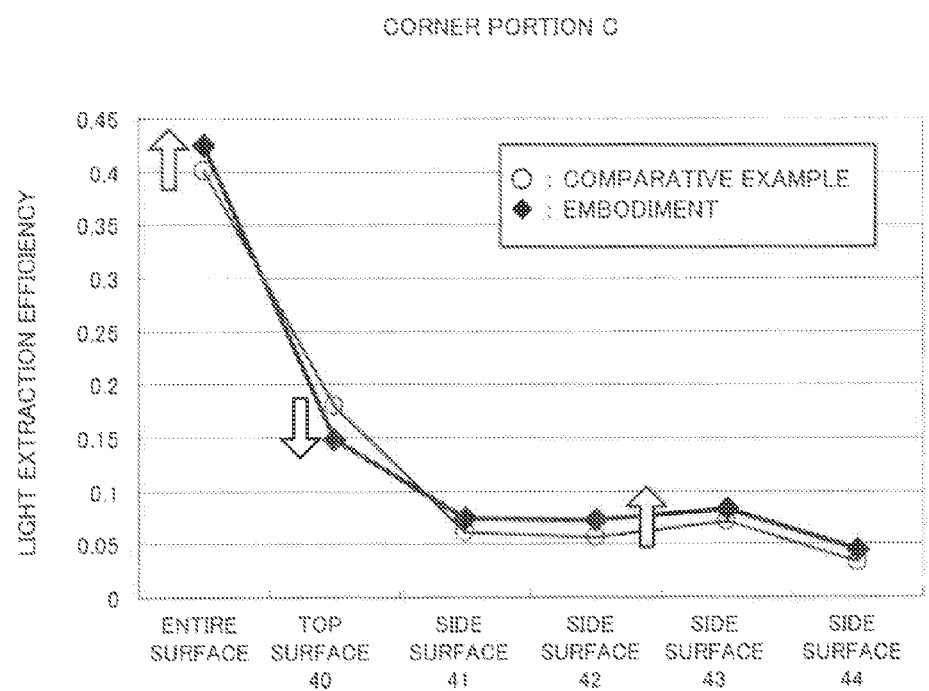
FIG. 6 is a diagram of a comparison between the first embodiment and the comparative example in terms of the efficiencies of light extraction from the semiconductor light emitting device in each of a corner portion.

FIGS. 5 and 6 are diagrams of a comparison between the embodiment and a comparative example in terms of the efficiencies of light extraction from the top surface 40 and the side surfaces 41, 42, 43, 44 in each of a central portion B and a corner portion C shown in FIG. 4.

In this respect, the comparative example was a semiconductor light emitting device in which the refractive indices n1, n2 of the respective first and second dielectric layers 14, 15 were equal to the refractive index n0 of the substrate 11, namely, a semiconductor light emitting device using a substrate on which mere protrusions and recesses were formed.

As shown in FIG. 5, the efficiency of the light extraction from the top surface 40 was 0.153 at the central portion B, and increased by about 17% compared to that of the comparative example which was 0.131. This indicated that the amount of light 34a reflected by the interface 32 shown in FIG. 2 increased.

Meanwhile, the efficiencies of the light extraction from the respective side surfaces 41, 42, 43, 44 were almost the same. This indicated that the decrease in the amount of light 34b transmitted to the substrate 11 did not lead to a direct decrease in the light extraction efficiency because, among the beams of light emitted from the central portion B, laterally propagating beams of light repeated reflection multiple times and were mostly absorbed in the course of the reflection.

As a result, the efficiency of the light extraction from the entire surface of the semiconductor light emitting device 10 was 0.298, and increased by about 7% compared to that of the comparative example which was 0.279.

As shown in FIG. 6, the efficiency of the light extraction from the top surface 40 was 0.149 in the corner portion C, and decreased by about 17% compared to that of the comparative example which was 0.179. This indicated that the amount of light 35a reflected by the interface 33 shown in FIG. 2 decreased.

On the other hand, the efficiencies of the light extraction from the respective side surfaces 41, 42, 43, 44 increased by about 20 to 30%. This indicated that the increase in the amount of light 35b transmitted to the substrate 11 led to a direct increase in the light extraction efficiency because, among the beams of light emitted from the corner portion C, laterally propagating beams of light were able to reach the side surfaces with a smaller number of reflections and most of the beams of light laterally propagating through the multiple repeated reflections were accordingly not absorbed.

As a result, the efficiency of the light extraction from the entire surface of the semiconductor light emitting device 10 was 0.425, and increased by about 6% compared to that of the comparative example which was 0.401.

The foregoing values of the light extraction efficiencies are examples. The light extraction efficiencies change in accordance with the widths W1, W2 and the spaces S1, S2. Further increase in the light extraction efficiencies is expected by optimizing the widths W1, W2 and the spaces S1, S2.

Note that the widths W1, W2 and the spaces S1, S2 need to be set to satisfy conditions which enable the formation of the first semiconductor layer 16 by lateral growth.

Next, a method for manufacturing the semiconductor light emitting device 10 is described. FIGS. 7A to 9C are cross-sectional views showing steps of manufacturing the semiconductor light emitting device in the sequence.

Figure 7A:
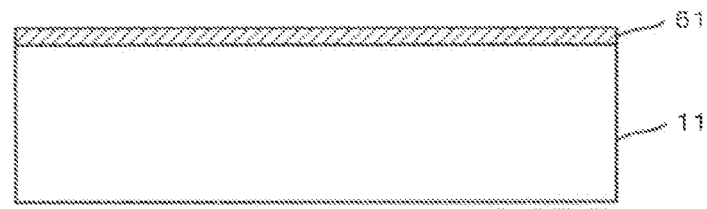
FIGS. 7A to 9C are cross-sectional views showing steps of manufacturing the semiconductor light emitting device in sequence.

As shown in FIG. 7A, a silicon nitride film 51 having a thickness of about 1 μm is formed on the substrate 11 by sputtering, for example.

Figure 7B:
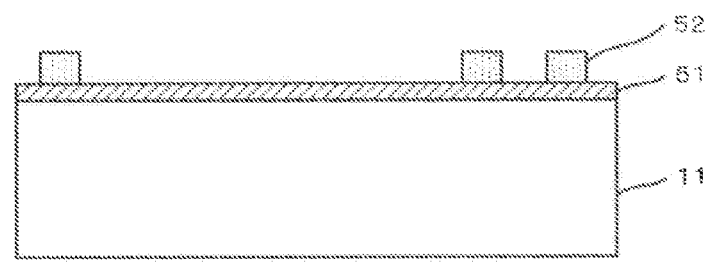

As shown in FIG. 7B, a resist film 52 having a pattern corresponding to the second dielectric layer 15 is formed on the silicon nitride film 51 in the second region 13 of the substrate 11 by photolithography.

Figure 7C:
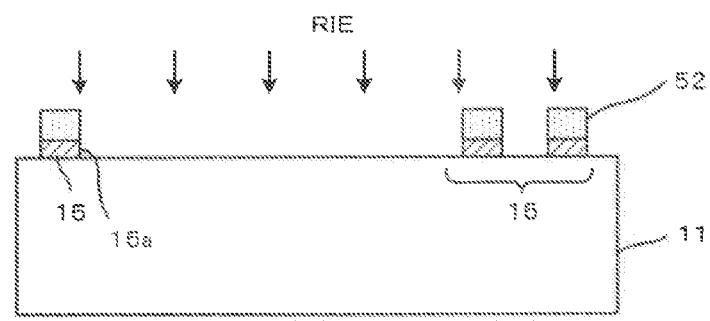

As shown in FIG. 7C, the silicon nitride film 51 is etched by reactive ion etching (RIE) using a fluorine-based gas with the resist film 52 being used as a mask. Thus, the second dielectric layer 15 having the side surfaces 15a substantially perpendicular to the substrate 11 is formed in the second region 13 of the substrate 11.

Figure 8A:
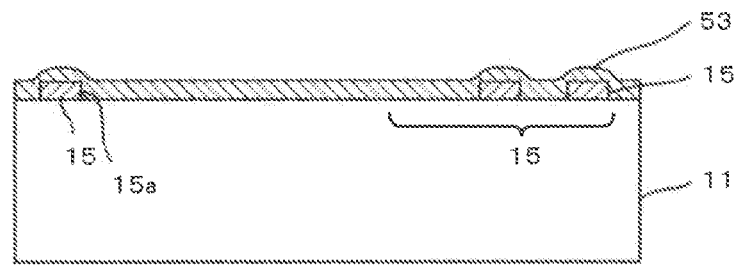

The resist film 52 is removed by an ashing technique using $O_2$, for example. Thereafter, as shown in FIG. 8A, a silicon oxide film 53 having a thickness of about 1 μm is formed on the substrate 11, on which the second dielectric layer 15 is formed, by sputtering, for example.

Figure 8B:
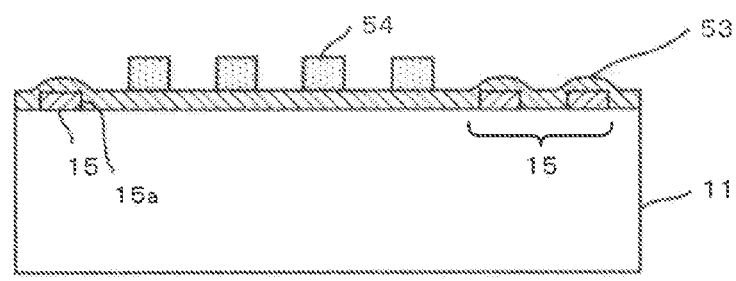

As shown in FIG. 8B, a resist film 54 having a pattern corresponding to the first dielectric layer 14 is formed on the silicon oxide film 53 in the first region 12 on the substrate 11 by photolithography.

Figure 8C:
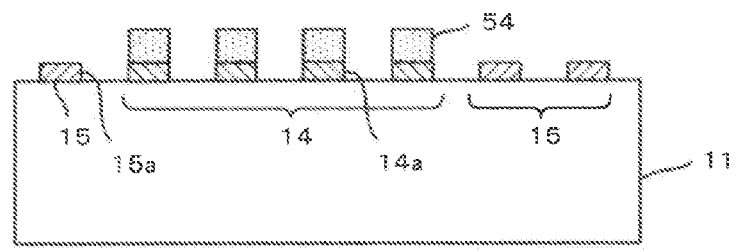

As shown in FIG. 8C, the silicon oxide film 53 is selectively etched by using an aqueous solution including hydrofluoric acid with the resist film 54 used as a mask. Thereby, the first dielectric layer 14 having the side surfaces 14a substantially perpendicular to the substrate 11 is formed in the first region 12 on the substrate 11.

Figure 9A:
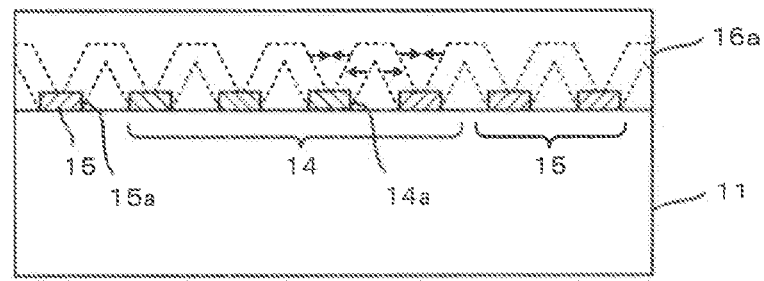

As shown in FIG. 9A, the undoped GaN layer 16a being the lower portion of the first semiconductor layer 16 is formed on the substrate 11 by metal organic chemical vapor deposition with the first dielectric layer 14 and the second dielectric layer 15 being used as masks.

Specifically, the buffer layer is formed on the substrate 11, and a GaN layer is grown by raising the temperature to a high temperature (1050° C. or less). The GaN layer does not grow on the masks, and grow on the substrate selectively in regions between the masks.

Facets appear as the GaN layer grows. Since the speed of the growth in the lateral directions is faster than the speed of the growth in the upward direction, the GaN layer grows on the masks as well. Laterally growing portions of the GaN layer unite together, and thus the GaN layer 16a having an almost flat surface is formed.

Figure 9B:
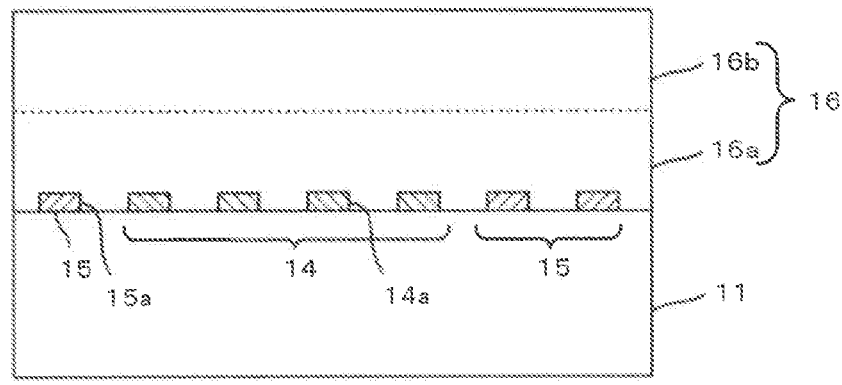

As shown in FIG. 9B, the N-type GaN layer 16b which is the upper portion of the first semiconductor layer 16 and which has a impurity concentration of about $2\times10^{18}$ cm$^{-3}$ is continuously formed while doped with silicon (Si) as the impurity.

Figure 9C:
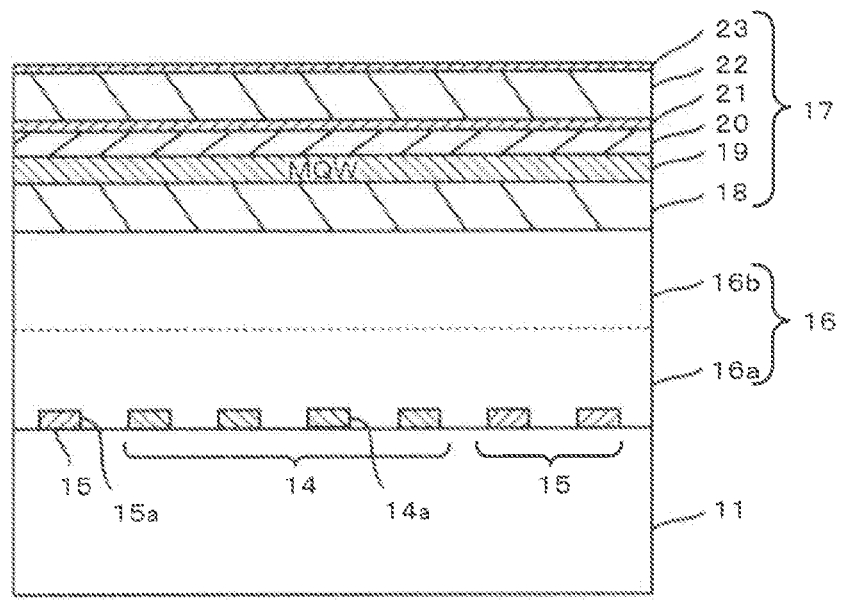
Figure 10A:
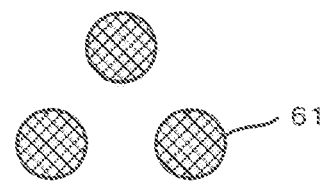
FIGS. 10A to 10D are diagrams showing shapes of a first dielectric layer and a second dielectric layer.
Figure 10B:
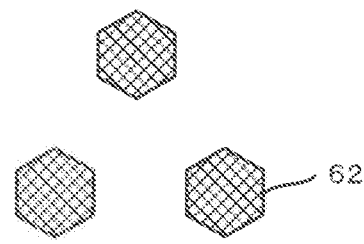
Figure 10C:
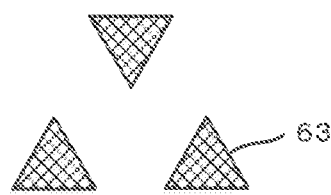
Figure 10D:
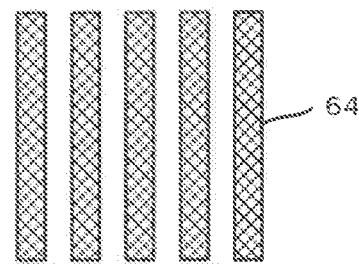
Figure 11A:
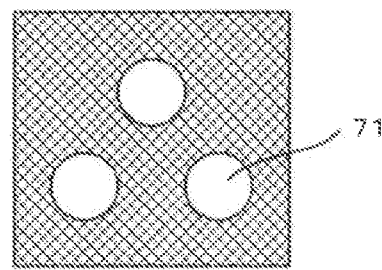
FIGS. 11A to 11D are diagrams showing shapes of the first dielectric layer and the second dielectric layer.
Figure 11B:
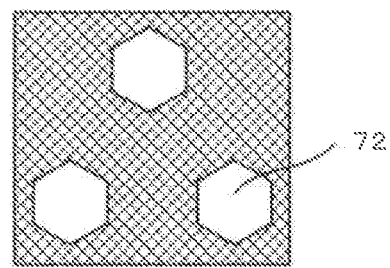
Figure 11C:
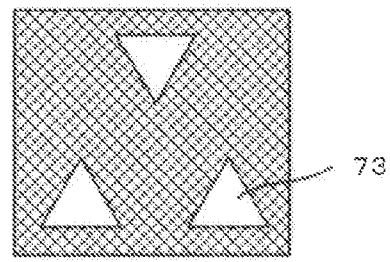
Figure 11D:
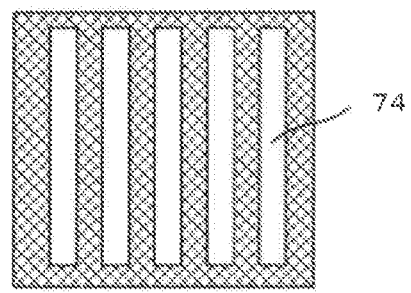

As shown in FIG. 9C, the second semiconductor layer 17 including the active layer having the PN junction is continuously formed on the first semiconductor layer 16 by MOCVD.

Specifically, the N-type GaN layer 18 having an impurity concentration of $1\times10^{18}$ cm$^{-3}$ and a film thickness of about 0.1 μm is crystal-grown on the N-type GaN layer 16b.

The MQW active layer 19 is formed on the N-type GaN layer 18. In the MQW active layer 19, quantum well layers and barrier layers are alternately stacked one on another. The quantum well layers each have a film thickness of about 2.5 nm, and are made from undoped $In_{0.2}Ga_{0.8}N$. The barrier layers are arranged between the quantum well layers, each have a film thickness of about 12.5 nm, and are made of $In_{0.02}Ga_{0.98}N$. The growth temperature of the MQW active layer 19 is 700 to 800° C. The peak wavelength of photoluminescence of the MQW active layer 19 at room temperature is about 450 nm.

The P-type GaN first layer 20 having an impurity concentration of about $4\times10^{18}$ cm$^{-3}$ and a film thickness of 30 nm, for example, is formed on the MQW active layer 19.

The P-type $Ga_{0.8}Al_{0.2}N$ layer (electron overflow prevention layer) 21 having an impurity concentration of about $4\times10^{18}$ cm$^{-3}$ and a film thickness of 10 nm, for example, is formed on the P-type GaN first layer 20.

The P-type GaN second layer 22 having an impurity concentration of $1\times10^{19}$ cm$^{-3}$ and a film thickness of 50 nm, for example, is formed on the P-type $Ga_{0.8}Al_{0.2}N$ layer (electron overflow prevention layer) 21.

The P-type GaN contact layer 23 having an impurity concentration of $1\times10^{20}$ cm$^{-3}$ and a film thickness of 60 nm, for example, is formed on the P-type GaN second layer 22.

The ITO transparent electrode 24 having a thickness of about 100 nm is formed on the P-type GaN contact layer 23 by sputtering, for example.

In the second region 13, lateral-side portions from the transparent electrode 24 to a portion of the first semiconductor layer 16 are dug by RIE, for example, and the first semiconductor layer 16 is exposed.

The N-side electrode 26 in which a titanium film having a thickness of 0.05 μm, a platinum film having a thickness of 0.05 μm and a gold film having a thickness of 0.2 μm, for example, are stacked one on another is formed on the first semiconductor layer 16.

The pad 25 and the pad 27 are formed respectively on the ITO transparent electrode 24 and the N-side electrode 26. The pads 25, 27 are each a gold film having a thickness of 0.2 μm. Thus, the semiconductor light emitting device 10 shown in FIGS. 1A and 1B is obtained.

As described above, the semiconductor light emitting device 10 of the embodiment includes the first dielectric layer 14 in the first region 12 on the substrate 11, and the second dielectric layer 15 in the second region 13 surrounding the first region 12, the first dielectric layer 14 having the refractive index n1 which is smaller than the refractive index n0 of the substrate 11, the second dielectric layer 15 having the refractive index n2 which is larger than the refractive index n0 of the substrate 11.

As a result, in the first region 12, the increase in the amount of the light 34a reflected by the interface 32 between the first dielectric layer 14 and the first semiconductor layer 16 can raise the efficiency of the light extraction from the top surface 40 without changing the efficiency of the light extraction from the side surfaces 41, 42, 43, 44.

In the second region 13, the increase in the amount of the light 35b passing through the interface 33 between the second dielectric layer 15 and the first semiconductor layer 16, and transmitted to the substrate 11, can raise the efficiency of the light extraction from the side surfaces 41, 42, 43, 44 although the efficiency of the light extraction from the top surface 40 decreases.

Thus, the efficiency of the light extraction from the entire surface can be increased. Hence, the semiconductor light emitting device 10 with higher light extraction efficiency is obtained.

Furthermore, no external electric field need be applied to the first dielectric layer 14 or the second dielectric layer 15. For this reason, the semiconductor light emitting device of the embodiment does not require electrodes to apply voltages, terminals to be connected to an external power source, or the like, unlike the semiconductor light emitting device disclosed in JP2008-153634. Hence, the semiconductor light emitting device 10 is advantageous in that the structure is simple.

The foregoing descriptions have been given of the configuration in which the shape of the islands of the first dielectric layer 14 and the second dielectric layer 15 is a circle. However, no specific restriction is imposed on the shape. It does not matter whether the shape of the islands of the first dielectric layer 14 is different from the shape of the islands of the second dielectric layer 15.

FIGS. 10A to 10D are diagrams showing the shapes of the islands of the first dielectric layer 14 and the second dielectric layer 15. As shown in FIGS. 10A to 10D, the islands are not limited to circular islands 61, and may be polygonal islands such as hexagonal islands 62 and triangular islands 63 as well. Moreover, the islands may be stripe-shaped islands 64.

The foregoing descriptions have been given of the configuration in which the first dielectric layer 14 and the second dielectric layer 15 are formed from the islands. However, each of the first dielectric layer 14 and the second dielectric layer 15 may be formed as a layer having openings.

FIGS. 11A to 11D are diagrams showing the first dielectric layer 14 and the second dielectric layer 15 each having openings. As shown in FIGS. 11A to 11D, the openings may be circular openings 71, hexagonal openings 72, or triangular openings 73. Moreover, the openings may be stripe-shaped openings 74.

The foregoing descriptions have been given of the configuration in which the second dielectric layer 15 is a silicon nitride film. However, no specific restriction is imposed on the material of the second dielectric layer 15, as long as the refractive index obtained from the material is higher than that of the substrate 11. Titanium oxide ($TiO_2$: n being approximately 2.5), zirconium dioxide ($ZrO_2$: n being approximately 2.15) and the like, for example, may be used.

Second Embodiment

Figure 12:
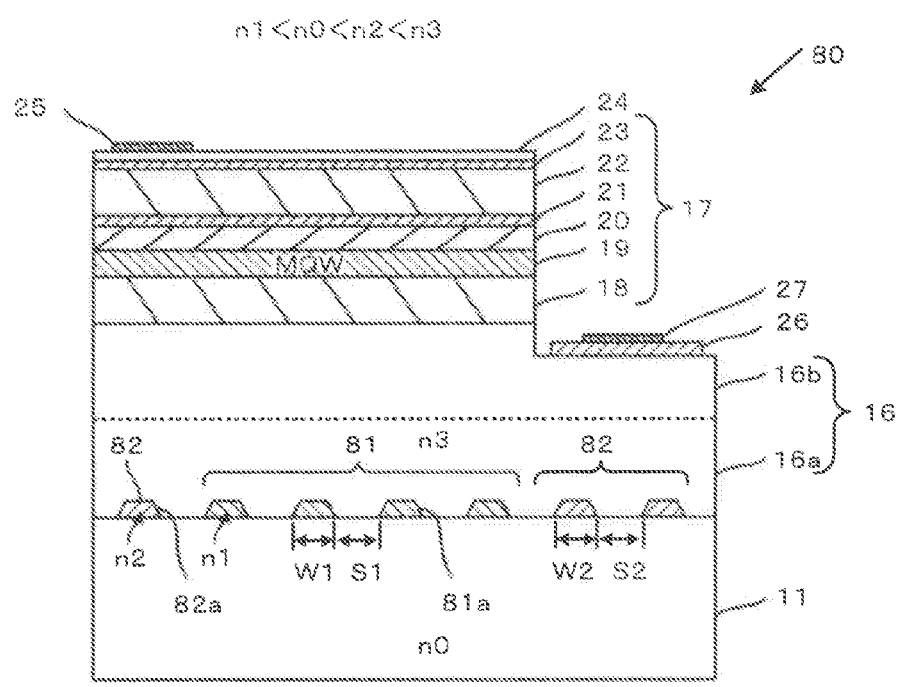
FIG. 12 is a view showing a semiconductor light emitting device according to a second embodiment.

A semiconductor light emitting device of a second embodiment will be described with reference to FIG. 12. FIG. 12 is a cross-sectional view showing the semiconductor light emitting device of the embodiment.

In the embodiment, constituent portions which are the same as those in the first embodiment are denoted with the same reference numerals, and descriptions of such constituent portions are omitted. Only different portions will be described. What makes the embodiment different from the first embodiment is that side surfaces of first dielectric layer and second dielectric layer are inclined.

Specifically, as shown in FIG. 12, in a semiconductor light emitting device 80 of the embodiment, side surfaces 81a of each island of a first dielectric layer 81 are inclined such that the width of the island becomes larger from the first semiconductor layer 16-side portion toward a substrate 11. Similarly, side surfaces 82a of each island of a second dielectric layer 82 are inclined such that the width of the island becomes larger from the first semiconductor layer 16-side portion toward the substrate 11.

In the semiconductor light emitting device 80 having the structure described above, beams of light incident on the inclined side surfaces 81a, 82a are totally reflected, and the travelling directions of the beams of light are changed. Thus, the efficiencies of the light extraction from the side surfaces of the semiconductor light emitting device 80 are increased by reducing the number of times the beams of light are reflected.

Figure 13:
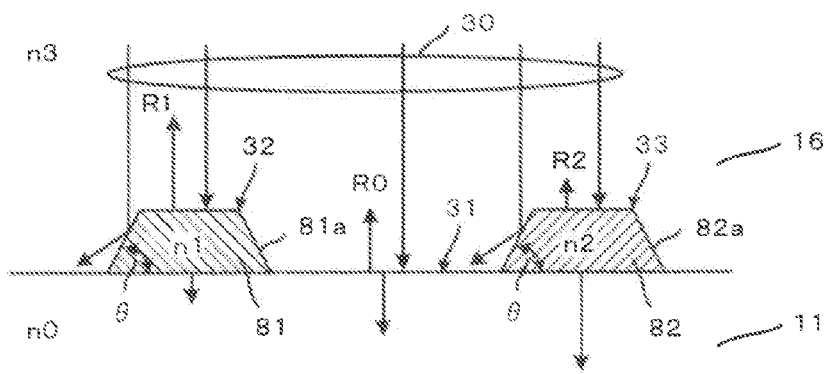
FIG. 13 is a diagram showing light reflection characteristics of a first dielectric layer and a second dielectric layer.

FIG. 13 is a diagram showing the light reflection characteristics of the first dielectric layer 81 and the second dielectric layer 82. As shown in FIG. 13, beams of light incident on the side surfaces 81a and the side surfaces 82a among beams of light 30 from a MQW active layer 19 are totally reflected, and the travelling directions of the beams of light change to directions diagonal to the substrate 11.

Thus, each of beam of light laterally propagating while repeating reflections multiple times in the semiconductor light emitting device 80 is reflected a fewer times, and the propagation distance of the beam of light to the corresponding one of the side surfaces becomes shorter. Thus, the amount of light absorbed in the course is reduced. As a result, the probability of the beams of light being extracted to the outside from the side surfaces of the semiconductor light emitting device 80 increases, and the light extraction efficiency is further improved.

It is appropriate to set an inclination angle $\theta$ of each of the side surfaces 81a and the side surfaces 82a in a range of about 50° to about 60°. This is because the total reflection angle of the first dielectric layer 81 is 30.3°, and because the total reflection angle of the second dielectric layer 82 is 39.8°.

To confirm this, a simulation was conducted on the efficiency of the light extraction from the semiconductor light emitting device 80. The results of the simulation are described below. In the simulation, the inclined angle $\theta$ of each of the side surfaces 81a and the side surfaces 82a was 60°, and the other conditions were the same as those of the first embodiment.

Figure 14:
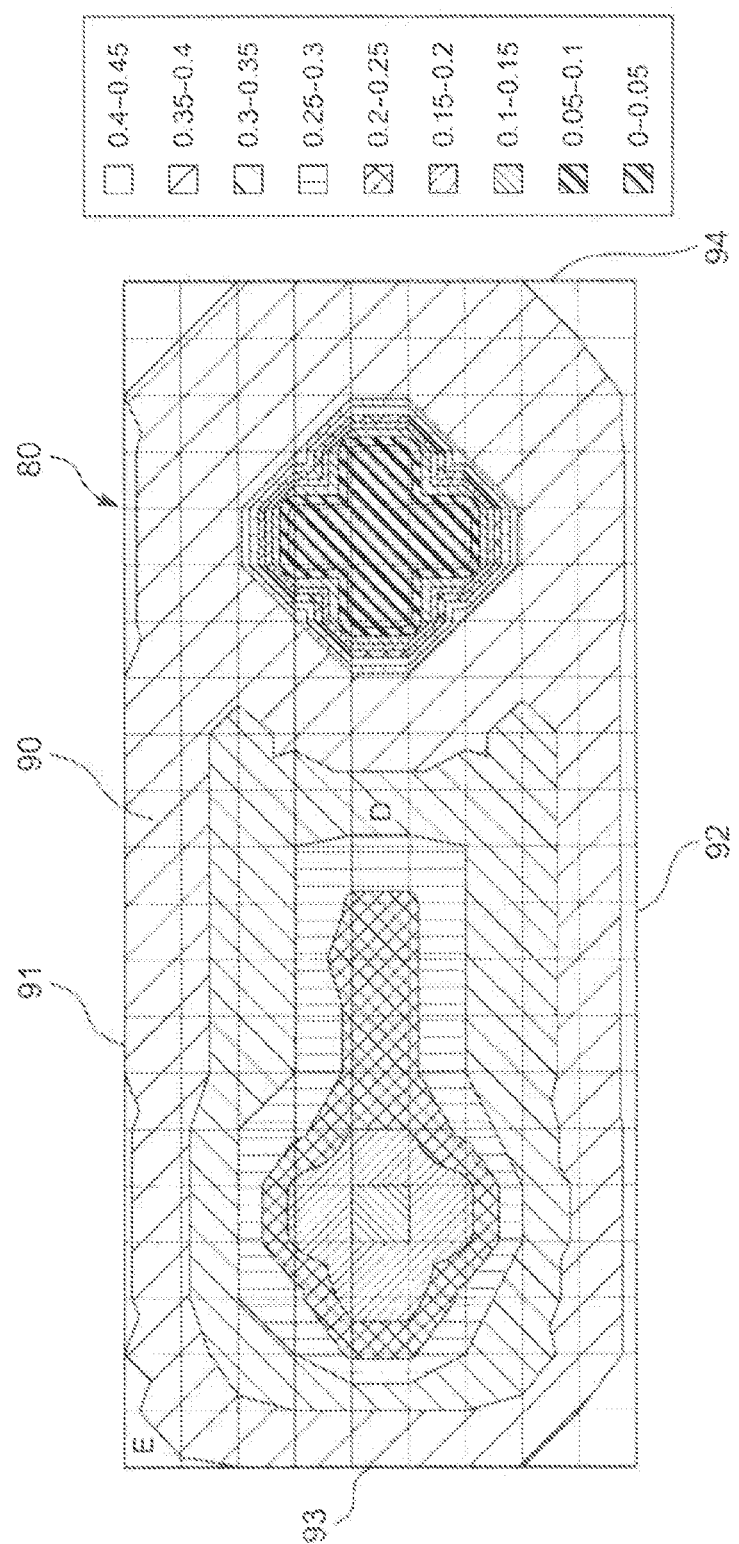
FIG. 14 is a diagram showing the in-plane distribution of the light extraction efficiency of the semiconductor light emitting device.

FIG. 14 is a diagram showing the in-plane distribution of the efficiency of the light extraction from the semiconductor light emitting device 80. As shown in FIG. 14, the in-plane distribution of the light extraction efficiency was roughly divided into regions around respective electrodes, a central region, and a peripheral region of the semiconductor element 80 in the ascending order of the light extraction efficiency. This was similar to the in-plane distribution of the light extraction efficiency of the semiconductor light emitting device 10 in FIG. 4.

However, the light extraction efficiency increased compared to that of the semiconductor light emitting device 10, and particularly the increase rate tended to become higher toward the outer periphery. Above all the portions, a corner portion E located at a position closest to the point where two side surfaces 91, 93 intersected exhibited the highest light extraction efficiency.

Figure 15:
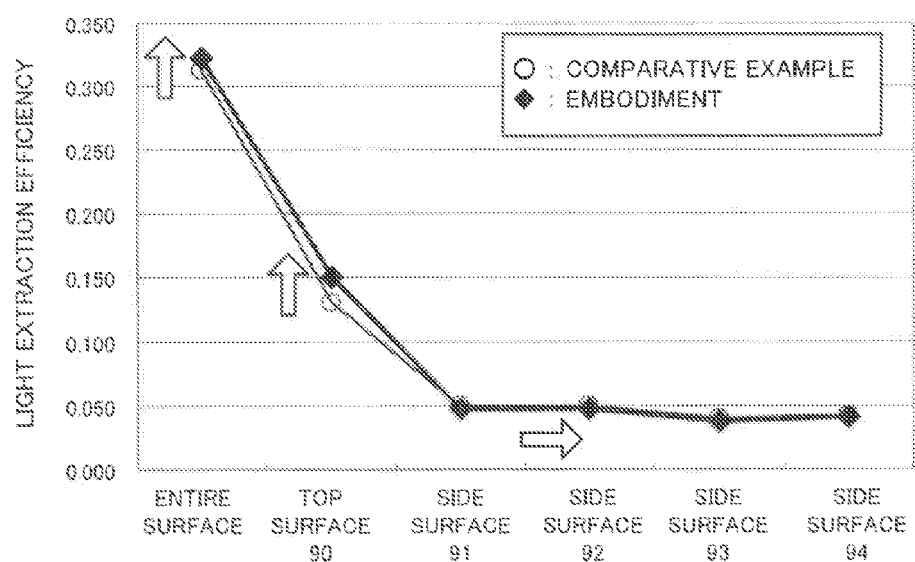
FIG. 15 is a diagram of a comparison between the second embodiment and a comparative example in terms of the efficiencies of light extraction from the semiconductor light emitting device in each of a central portion.
Figure 16:
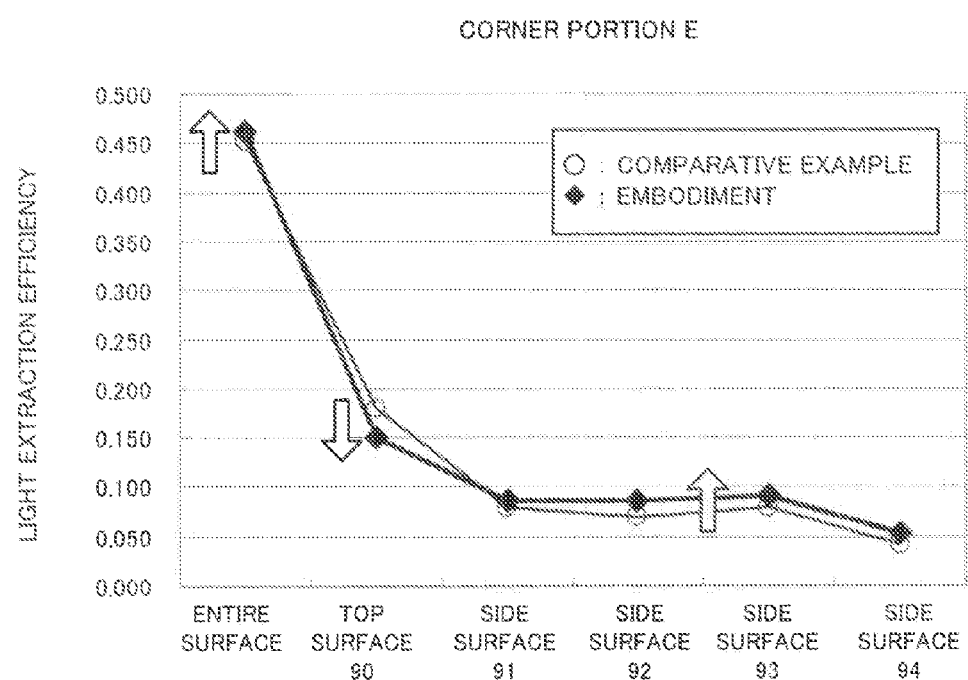
FIG. 16 is a diagram of a comparison between the second embodiment and the comparative example in terms of the efficiencies of light extraction from the semiconductor light emitting device in each of a corner portion.

FIGS. 15 and 16 are diagrams showing a comparison between the embodiment and a comparative example in terms of the efficiencies of the light extraction from a top surface 90 and side surfaces 91, 92, 93, 94. In this respect, the comparative example was a semiconductor light emitting device in which refractive indices n1, n2 of the respective first and second dielectric layers 81, 82 were equal to the refractive index n0 of the substrate 11, namely, a semiconductor light emitting device using a substrate on which mere protrusions and recesses with inclined side surfaces were formed.

As shown in FIG. 15, the efficiency of the light extraction from the top surface 90 was 0.150 at a central portion D, and increased by about 15% compared to that of the comparative example which was 0.130. On the other hand, the efficiencies of the light extraction from the respective side surfaces 91, 92, 93, 94 were almost the same.

As a result, the efficiency of the light extraction from the entire surface of the semiconductor light emitting device was 0.323, and increased by about 3% compared to that of the comparative example which was 0.313.

As shown in FIG. 16, the efficiency of the light extraction from the top surface 90 was 0.150 at the corner portion E, and decreased by about 17% compared to that of the comparative example which was 0.180. On the other hand, the efficiencies of the light extraction from the respective side surfaces 91, 92, 93, 94 increased by about 10 to 20%.

As a result, the efficiency of the light extraction from the entire surface of the semiconductor light emitting device was 0.462, and increased by about 2.2% compared to that of the comparative example which was 0.452.

Next, the efficiency of the light extraction from the semiconductor light emitting device 80 of the embodiment and the efficiency of the light extraction from the semiconductor light emitting device 10 of the first embodiment are compared with each other.

As shown in FIGS. 5 and 15, in the central portion D and the central portion B, the efficiency (0.150) of the light extraction from the top surface 90 is slightly lower than the efficiency (0.153) of the light extraction from the top surface 40 (by about 2%), but the two light extraction efficiencies are almost the same.

On the other hand, the efficiencies of the light extraction from the side surfaces 91, 92, 93, 94 were higher than the efficiencies of the light extraction from the side surfaces 41, 42, 43, 44, respectively, by about 10 to about 30%.

As shown in FIGS. 6 and 16, in the corner portion E and the corner portion C, the efficiency (0.150) of the light extraction from the top surface 90 is slightly higher than the efficiency (0.149) of the light extraction from the top surface 40 (by about 1%), but the two light extraction efficiencies are almost the same.

On the other hand, the efficiencies of the light extraction from the side surfaces 91, 92, 93, 94 were higher than the efficiencies of the light extraction from the side surfaces 41, 42, 43, 44, respectively, by about 10 to about 20%.

Furthermore, the efficiency of the light extraction from the comparative example of the embodiment and the efficiency of the light extraction from the comparative example of the first embodiment are compared with each other.

In the central portion D and the central portion B, the efficiency (0.130) of the light extraction from the top surface 90 was almost equal to the efficiency (0.131) of the light extraction from the top surface 40.

On the other hand, the efficiencies of the light extraction from the side surfaces 91, 92, 93, 94 were higher than the efficiencies of the light extraction from the side surfaces 41, 42, 43, 44, respectively, by about 16 to about 38%.

In the corner portion E and the central portion C, the efficiency (0.180) of the light extraction from the top surface 90 was almost equal to the efficiency (0.179) of the light extraction from the top surface 40.

On the other hand, the efficiencies of the light extraction from the side surfaces 91, 92, 93, 94 were higher than the efficiencies of the light extraction from the side surfaces 41, 42, 43, 44, respectively, by about 13 to about 31%.

From the findings, it has been confirmed that the inclined side surfaces 81a of the island of the first dielectric layer 81 and the inclined side surfaces 82a of the island of the second dielectric layer 82 did not contribute to the efficiency of the light extraction from the top surface 80, but contribute to the increase in the efficiencies of the light extraction from the side surfaces 91, 92, 93, 94.

Next, a method for manufacturing the semiconductor light emitting device 80 is described. FIGS. 17A to 18D are cross-sectional views showing steps of manufacturing the semiconductor light emitting device in sequence.

Figure 17A:
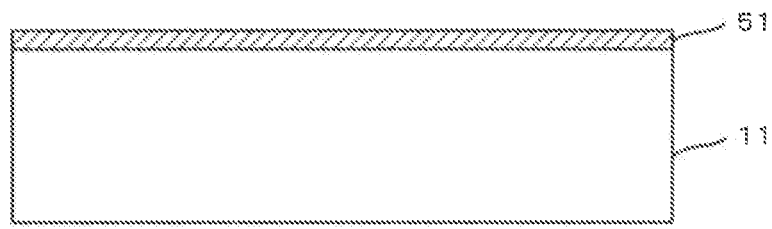
FIGS. 17A to 18D are cross-sectional views showing steps of manufacturing the semiconductor light emitting device in sequence.

As shown in FIG. 17A, a silicon nitride film 51 having a thickness of about 1 μm is formed on the substrate 11 as in the case shown in FIG. 7A.

Figure 17B:
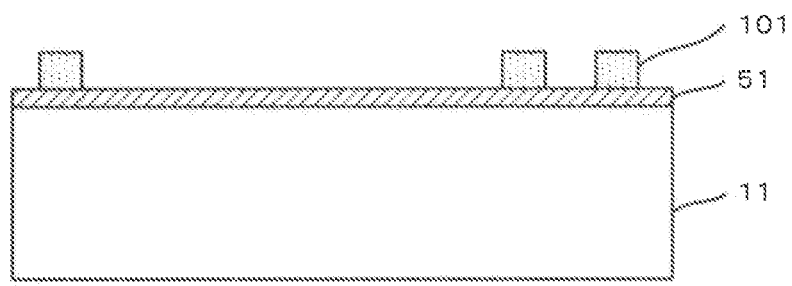

As shown in FIG. 17B, a resist film 101 having a pattern corresponding to the second dielectric layer 82 is formed on the silicon nitride film 51 in the second region 13 by photolithography.

Figure 17C:
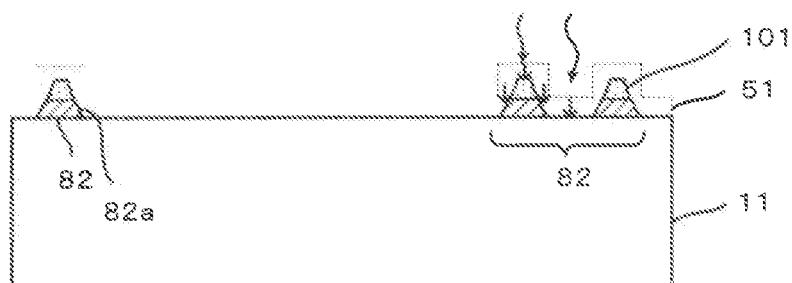

As shown in FIG. 17C, the silicon nitride film 51 is anisotropically etched by RIE using a mixed gas of an oxygen gas and a fluorine-based gas with the resist film 101 used as a mask, and by controlling the selection ratio between the resist film 101 and the silicon nitride film 51.

Specifically, the etching is performed by using the mixed gas of the oxygen gas to etch the resist film 101 and the fluorine-based gas ($CHF_3$, $CF_4$, $SF_6$ or the like) to etch the silicon nitride film 51, under a condition where the selection ratio between the silicon nitride film 51 and the resist film 101 is small.

In other words, the resist film 101 is etched together with the silicon nitride film 51 by making the control in order that the difference between the etching speed of the silicon nitride film 51 and the etching speed of the resist film 101 is made small. Accordingly, as the resist film 101 becomes thinner, the silicon nitride film 51 also becomes thinner.

Thus, the second dielectric layer 82 is formed, in which the side surfaces 82a of each island incline in the way that the width of the island becomes larger from the top toward the substrate 11. The inclination angle of the side surfaces 82a of each island of the second dielectric layer 82 is set at about 60° by controlling the selection ratio.

Figure 18A:
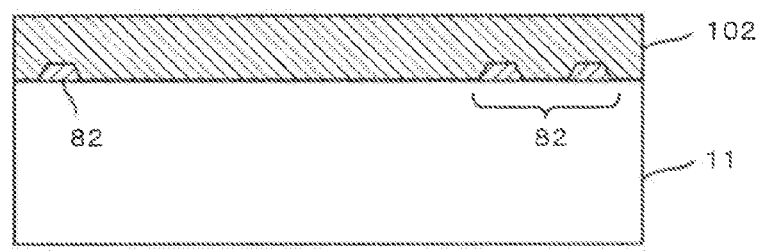

A remaining portion of the resist film 101 is removed by ashing using $O_2$, for example. Thereafter, as shown in FIG. 18A, a silicon oxide film 102 having a thickness of about 3 μm is formed on the substrate 11, on which the second dielectric layer 82 is formed, by sputtering, for example. Thus, the second dielectric layer 82 is buried.

Figure 18B:
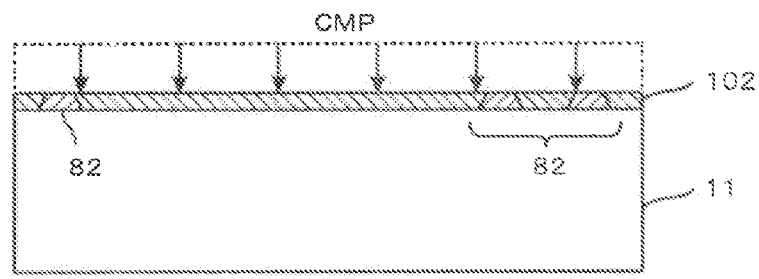

As shown in FIG. 18B, an excessive portion of the silicon oxide film 102 is removed by chemical mechanical polishing (CMP), for example. Thus, the second dielectric layer 82 is exposed. This process is performed to make the height of the first dielectric layer 81 and the height of the second dielectric layer 82 equal to each other.

Figure 18C:
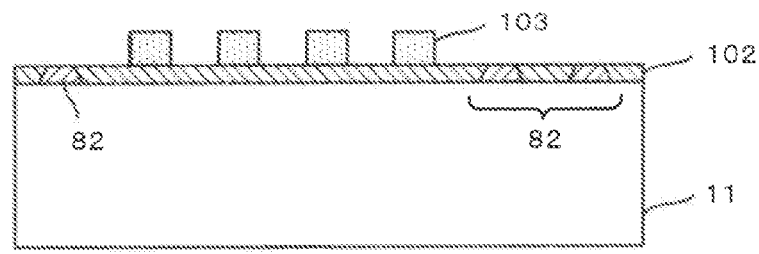

As shown in FIG. 18C, a resist film 103 having a pattern corresponding to the first dielectric layer 81 is formed on the silicon oxide film 102 in the first region 12 by photolithography.

Figure 18D:
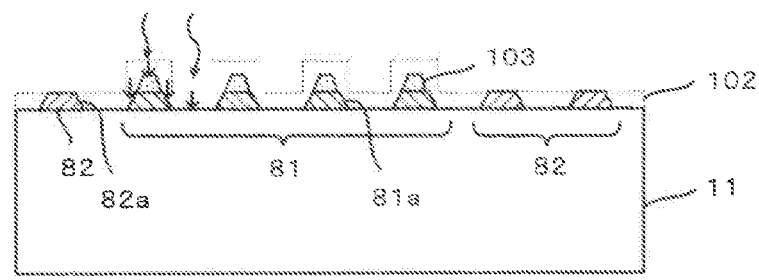

As shown in FIG. 18D, the silicon oxide film 102 is selectively anisotropically etched by RIE using a mixed gas of an oxygen gas and a chlorine-based gas with the resist film 103 used as a mask, and by controlling the selection ratio between the resist film 103 and the silicon oxide film 102.

Specifically, the etching is performed by using the mixed gas of the oxygen gas to etch the resist film 103 and the chlorine-based gas to etch the silicon oxide film 102, for example, under a condition where the selection ratio between the silicon oxide film 102 and the resist film 103 is small.

In other words, the resist film 103 is etched together with the silicon oxide film 102 by making the control in order that the difference between the etching speed of the silicon oxide film 102 and the etching speed of the resist film 103 is made small. Accordingly, as the resist film 103 becomes thinner, the silicon oxide film 102 also becomes thinner.

Thus, the first dielectric layer 81 is formed, in which the side surfaces 81a of each island incline in the way that the width of the island becomes larger from the top toward the substrate 11. The inclination angle of the side surfaces 81a of each island of the first dielectric layer 81 is set almost equal to the inclination angle of the side surfaces 82*a* of each island of the second dielectric layer 82 by controlling the selection ratio.

A remaining portion of the resist film 103 is removed by ashing using $O_2$, for example. Thereafter, the first semiconductor layer 16 and the second semiconductor layer 17 are formed in accordance with the steps shown in FIG. 9A to 9C. Furthermore, an N-side electrode 26 and pads 25, 27 are formed. Thus, the semiconductor light emitting device 80 shown in FIG. 12 is obtained.

As described above, in the semiconductor light emitting device 80 of the embodiment, the side surfaces 81*a* of each island of the first dielectric layer 81 and the side surfaces 82*a* of each island of the second dielectric layer 82 incline in a way that the width of each island becomes larger from the first semiconductor layer 16-side portion toward the substrate 11.

As a result, the travelling directions of the beams of light incident on the inclined side surfaces 81*a*, 82*a* change. Each of the beams of light laterally propagating while reflected multiple times in the semiconductor light emitting device 80 is reflected a fewer times, and the propagation distance of the beam of light to the corresponding one of the side surfaces is made shorter. This increases the probability that the beams of light are extracted to the outside from the side surfaces 91, 92, 93, 94. Hence, the semiconductor light emitting device 80 is advantageous in that the light extraction efficiency can be further increased.

What is claimed is:

1. A semiconductor light emitting device, comprising:
   a substrate;
   a first dielectric layer formed in a first region on the substrate, and having a refractive index smaller than a refractive index of the substrate;
   a second dielectric layer formed in a second region on the substrate surrounding the first region, and having a refractive index larger than the refractive index of the substrate;
   a first semiconductor layer formed on the first dielectric layer, the second dielectric layer and the substrate;
   a second semiconductor layer; and
   an active layer interposed between the first semiconductor layer and the second semiconductor layer.

2. The semiconductor light emitting device according to claim 1, wherein the substrate is of a sapphire, the first dielectric layer is of a silicon oxide, the second dielectric layer is of a silicon nitride, and the first semiconductor layer and the second semiconductor layer each are of a nitride-based group III-V compound semiconductor.

3. The semiconductor light emitting device according to claim 1, wherein the first dielectric layer includes a plurality of islands formed in a scattered manner in the first region, and the second dielectric layer includes a plurality of islands formed in a scattered manner in the second region.

4. The semiconductor light emitting device according to claim 3, wherein the islands have any one of a circular shape, a polygonal shape and a stripe shape.

5. The semiconductor light emitting device according to claim 1, wherein the first dielectric layer has a plurality of openings formed in a scattered manner in the first region, and the second dielectric layer has a plurality of openings formed in a scattered manner in the second region.

6. The semiconductor light emitting device according to claim 5, wherein the openings have any one of a circular shape, a polygonal shape and a stripe shape.

7. The semiconductor light emitting device according to claim 1, wherein a side surface of each of the first dielectric layer and the second dielectric layer is such an inclined surface that the first dielectric layer or the second dielectric layer has a width becoming larger from a first semiconductor layer-side portion toward a substrate.

8. The semiconductor light emitting device according to claim 1, wherein the first semiconductor layer is a semiconductor layer which is grown selectively on the substrate with the first dielectric layer and the second dielectric layer used as masks, and is further grown in the lateral direction so that growing portions of the semiconductor layer unite together.

9. The semiconductor light emitting device according to claim 1, wherein the substrate is transparent to a wavelength of light emitted from the active layer.

* * * * *